(12) United States Patent
Wang

(10) Patent No.: US 8,159,001 B2
(45) Date of Patent: Apr. 17, 2012

(54) GRADED JUNCTION HIGH VOLTAGE SEMICONDUCTOR DEVICE

(75) Inventor: Bin Wang, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 537 days.

(21) Appl. No.: 11/490,407

(22) Filed: Jul. 19, 2006

(65) Prior Publication Data

US 2007/0093028 A1     Apr. 26, 2007

Related U.S. Application Data

(63) Continuation-in-part of application No. 10/884,326, filed on Jul. 2, 2004, now Pat. No. 7,145,203.

(60) Provisional application No. 60/773,694, filed on Feb. 15, 2006.

(51) Int. Cl.
    *H01L 29/72* (2006.01)

(52) U.S. Cl. ........ 257/134; 257/335; 257/336; 257/337; 257/338; 257/339; 257/343; 257/412

(58) Field of Classification Search .................. 257/134, 257/335–339, 343, 412
    See application file for complete search history.

(56) References Cited

U.S. PATENT DOCUMENTS

| | | | |
|---|---|---|---|
| 4,697,332 A * | 10/1987 | Joy et al. | 438/420 |
| 4,745,079 A | 5/1988 | Pfiester | |
| 5,485,027 A | 1/1996 | Williams et al. | |
| 5,553,030 A | 9/1996 | Tedrow et al. | |
| 5,585,660 A | 12/1996 | Mei | |
| 5,593,909 A | 1/1997 | Han et al. | |
| 5,751,042 A * | 5/1998 | Yu | 257/360 |
| 5,753,952 A | 5/1998 | Mehrad | |
| 6,023,188 A | 2/2000 | Lee et al. | |
| 6,097,070 A | 8/2000 | Mandelman et al. | |
| 6,160,289 A | 12/2000 | Kwon et al. | |
| 6,160,290 A | 12/2000 | Pendharkar et al. | |
| 6,177,830 B1 | 1/2001 | Rao | |
| 6,211,552 B1 | 4/2001 | Efland et al. | |
| 6,350,637 B1 | 2/2002 | Maurelli et al. | |
| 6,461,918 B1 | 10/2002 | Calafut | |
| 6,548,874 B1 | 4/2003 | Morton et al. | |
| 6,555,883 B1 | 4/2003 | Disney et al. | |

(Continued)

FOREIGN PATENT DOCUMENTS

WO    WO 2004/006340 A1    1/2004

OTHER PUBLICATIONS

Bassin, C. et al., "High-Voltage Devices for O.5-μm Standard CMOS Technology", IEEE Electron Device Letters, Jan. 2000, pp. 41-42, vol. 21, No. 1.

(Continued)

*Primary Examiner* — Edward Wojciechowicz
(74) *Attorney, Agent, or Firm* — Fenwick & West LLP

(57) ABSTRACT

A graded junction space decreasing an implant concentration gradient between n-well and p-well regions of a semiconductor device is provided for enhancing breakdown voltage in high voltage applications. Split or unified FOX regions may be provided overlapping with the graded junction space. By using a p-well blocking layer to separate the p-well(s) and the n-well, breakdown voltage characteristic is improved without the cost of an additional mask or process change.

45 Claims, 12 Drawing Sheets

P-N JUNCTION DEVICE
WITH CONTINUOUS FOX

U.S. PATENT DOCUMENTS

| | | | |
|---|---|---|---|
| 6,559,683 | B1 | 5/2003 | Kwon et al. |
| 6,593,621 | B2 | 7/2003 | Tsuchiko et al. |
| 6,661,278 | B1 | 12/2003 | Gilliland |
| 6,665,012 | B1 | 12/2003 | Yang et al. |
| 6,678,190 | B2 | 1/2004 | Yang et al. |
| 6,730,458 | B1 | 5/2004 | Kim et al. |
| 6,734,493 | B2 | 5/2004 | Chen et al. |
| 6,831,331 | B2 | 12/2004 | Kitamura et al. |
| 6,873,021 | B1 | 3/2005 | Mitros et al. |
| 6,882,023 | B2 | 4/2005 | Khemka et al. |
| 6,989,302 | B2 | 1/2006 | Makovicka et al. |
| 7,091,535 | B2 | 8/2006 | Tsai et al. |
| 2002/0028541 | A1 | 3/2002 | Lee et al. |

OTHER PUBLICATIONS

Declercq, M. et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, J.F., "On-Chip High-Voltage Generation in MNOS Integrated Circuits Using an Improved Voltage Multiplier Technique", IEEE Journal of Solid-State Circuits, Jun. 1976, pp. 374-378, vol. SC-11, No. 3.

Favrat, P. et al., "A High-Efficiency CMOS Voltage Doubler," IEEE Journal of Solid-State Circuits, Mar. 1998, pp. 410-416, vol. 33, No. 3.

Khemka, V. et al., "A Floating RESURF (FRESURF) LD-MOSFET Device Concept," IEEE Electron Device Letters, Oct. 2003, pp. 664-666, vol. 24, No. 10.

Witters, J.S. et al., "Analysis and Modeling of On-Chip High-Voltage Generator Circuits for Use in EEPROM Circuits," IEEE Journal of Solid• State Circuits, Oct. 1989, pp. 1372-1380, vol. 24, No. 5.

United States Office Action, U.S. Appl. No. 10/952,708, Apr. 9, 2008, 7 pages.

United States Office Action, U.S. Appl. No. 10/952,708, Sep. 28, 2007, 6 pages.

United States Office Action, U.S. Appl. No. 10/952,708, Apr. 11, 2007, 10 pages.

United States Office Action, U.S. Appl. No. 10/952,708, Jun. 14, 2006, 17 pages.

United States Office Action, U.S. Appl. No. 11/138,888, Jun. 22, 2007, 16 pages.

United States Office Action, U.S. Appl. No. 11/138,888, Nov. 17, 2006, 19 pages.

Declercq, M. et al., "Design and Optimization of High-Voltage CMOS Devices Compatible with a Standard 5V CMOS Technology," IEEE 1993 Custom Integrated Circuits Conference, pp. 24.6.1-24.6.4 (clean copy with added reference numerals).

United States Office Action, U.S. Appl. No. 10/884,236, Dec. 15, 2005, 4 pages.

United States Office Action, U.S. Appl. No. 10/884,236, Mar. 26, 2007, 16 pages.

United States Office Action, U.S. Appl. No. 10/884,326, Dec. 15, 2005, 4 pages.

United States Office Action, U.S. Appl. No. 11/138,888, Sep. 11, 2007, 3 pages.

\* cited by examiner

*LAYOUT OF TRANSISTOR
DEVICE OF FIGURE 3A*

*LAYOUT OF TRANSISTOR
DEVICE OF FIGURE 4A*

GRADED JUNCTION HIGH
VOLTAGE TRANSISTOR DEVICE
IN AN APPLICATION

CROSS-SECTION VIEW OF THE APPLICATION OF FIGURE 5A

GRADED JUNCTION HIGH VOLTAGE SEMICONDUCTOR DEVICE

RELATED APPLICATIONS

This utility patent application claims the benefit of U.S. Provisional Application Ser. No. 60/773,694 filed on Feb. 15, 2006, which is hereby claimed under 35 U.S.C. §119(e). The provisional application is incorporated herein by reference.

This utility patent application is a continuation-in-part (CIP) of U.S. patent application Ser. No. 10/884,326, filed Jul. 2, 2004 (now U.S. Pat. No. 7,145,203, Issued Dec. 5, 2006). The benefit of the earlier filing date of the parent application is hereby claimed under 35 U.S.C. §120. This application may also be considered related to U.S. patent application Ser. No. 10/952,708 filed on Sep. 28, 2004 and U.S. patent application Ser. No. 11/138,888 filed on May 6, 2005 (now U.S. Pat. No. 7,375,398, Issued May 20, 2008).

TECHNICAL FIELD

The present invention relates to semiconductor devices, and more particularly, to devices and methods of forming and manufacturing such devices for enhanced high voltage operations.

BACKGROUND

In a typical semiconductor device, a nominal n-well is used to sustain high voltage as part of a standard CMOS process for tunneling transistors or coupling capacitors. Such high voltage components may be implemented in charge pump circuits, high voltage switch circuits, and the like.

Furthermore, a high voltage n-well which can sustain a voltage as high as 20V may be needed for a memory device with 5V I/O oxide developed in a standard CMOS process without extra masks for high voltage circuits and components (e.g. charge pumps, high voltage switches, tunneling transistors, LDMOS). However, the breakdown voltage of the n-well is usually determined by the I/O or logic device and decreases with more advanced technology.

A high voltage n-well, which can sustain a voltage as high as 12V, may be needed for a memory device (e.g. Non-Volatile Memory) with 3.3V I/O oxide developed in a standard CMOS process without extra masks for high voltage circuits and components. However, the breakdown of the n-well decreases with more advanced technology implementing thinner layers (0.18 micron MFS, 0.13 micron MFS, 0.09 micron MFS, etc.). For example, a 0.13 micron MFS device has an n-well breakdown voltage of 10V.

As device geometries and minimum feature sizes (MFS) shrink, e.g., from 0.18 micron MFS to 0.13 micron MFS to 0.09 micron MFS and beyond, new ways to provide relatively high breakdown voltages, particularly in logic CMOS processes, become more and more important. Logic CMOS is important because it is commonly available at low cost with minimum process steps.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments are directed to semiconductor devices with a graded junction space between one or more p-wells and an n-well. In a p-n junction device according to one embodiment, the p-well and the n-well regions are separated by a graded junction space that is disposed as part of the p-substrate or doped with p+ or n+ implants to provide an implant concentration gradient of at least a magnitude. According to some embodiments, split or connected FOX regions may be formed overlapping with the graded junction space.

According to other embodiments, a transistor device may be implemented with graded junction spaces between each p-well region and the centrally located n-well region. Substrate taps may be disposed within the p-well regions or within p+ doped surface regions in either (or both) graded junction spaces.

As a result of decreased implant concentration gradient around the n-well region higher diode breakdown voltages may be achieved without the cost of an added mask.

Other embodiments may be implemented with the gate structures of the semiconductors devices configured as floating gate(s). Such implementations may be used in high voltage switches, charge pump circuits, and the like.

This and other features and advantages of the invention will be better understood in view of the Detailed Description and the Drawings, in which:

BRIEF DESCRIPTION OF THE DRAWINGS

Non-limiting and non-exhaustive embodiments are described with reference to the following drawings.

DETAILED DESCRIPTION

Figure 1:
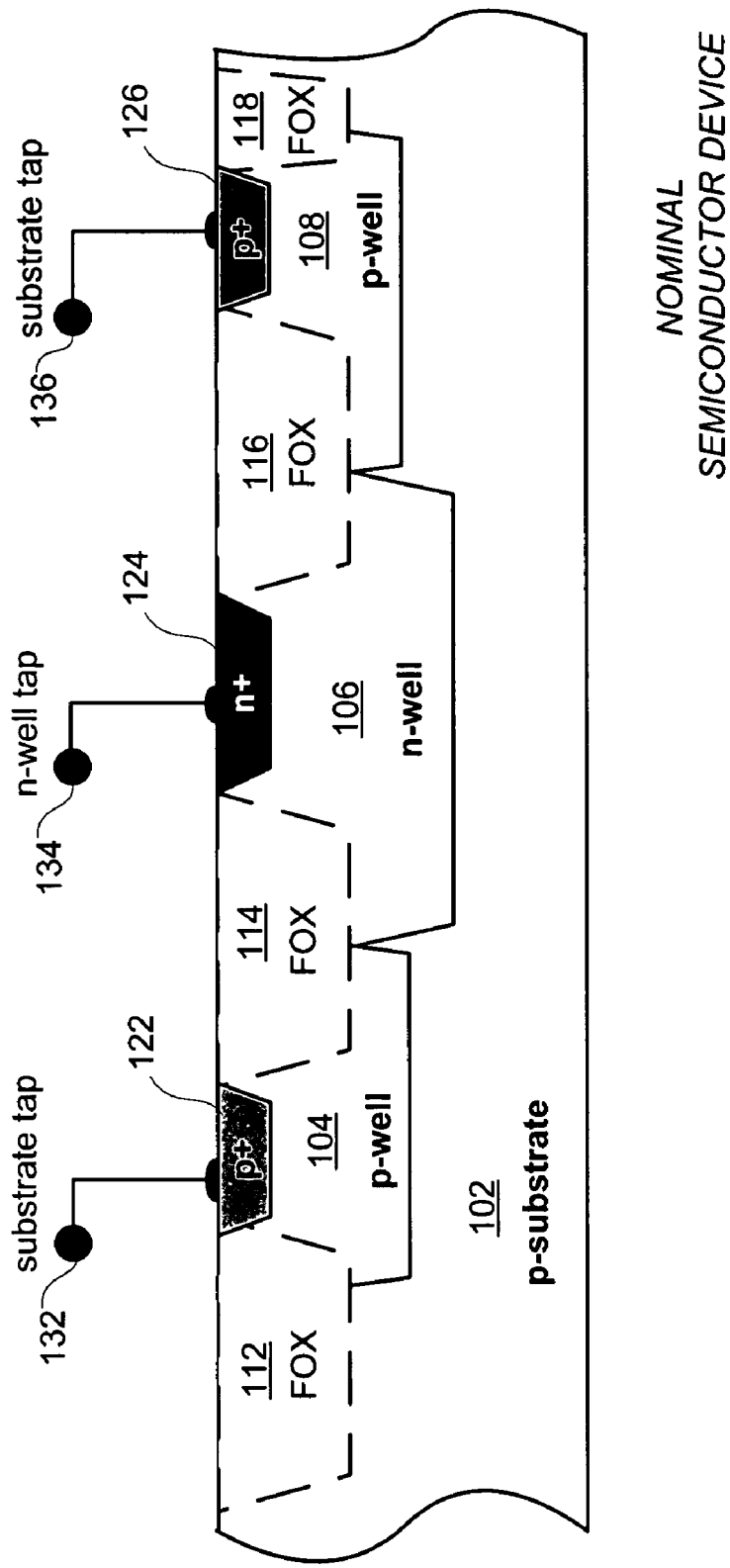
FIG. 1 is a cross-sectional view of a nominal semiconductor device.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed subject matter.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

FIG. 1 illustrates cross-sectional view of a nominal semiconductor device 100. Nominal semiconductor device 100 may be formed on p-substrate 102 that includes impurities of p-type. P-substrate 102 includes n-well 106 that is doped with impurities of n-type and p-wells 104 and 108 that are further doped with impurities of p-type.

Optional field oxide regions 114 and 116 are disposed over portions of n-well 106 and p-wells 104 and 108, where the regions come into contact. Optional field oxide regions 112 and 118 may be formed on opposite sides of p-wells 104 and 108, respectively. P+ doped surface region 122 within p-well 104 may be used for providing a substrate tap contact 132. Similarly, p+ doped surface region 126 within p-well 108 may be used for providing another substrate tap contact 136. These contacts may be used in a circuit to provide source and/or body terminals of a transistor circuit.

N+ doped surface region 124 within n-well 106 may be used for providing an n-well tap contact 134, which may be used to provide a drain terminal of the transistor circuit. In addition to the optional FOX regions, a nominal semiconductor device may be constructed in different orders or sizes of the individual regions. Due to the approximation of the n-well and p-well regions, however, breakdown voltages may tend to be lower for these devices, especially when smaller MFS advanced technology manufacturing processes are implemented.

Figure 2A:
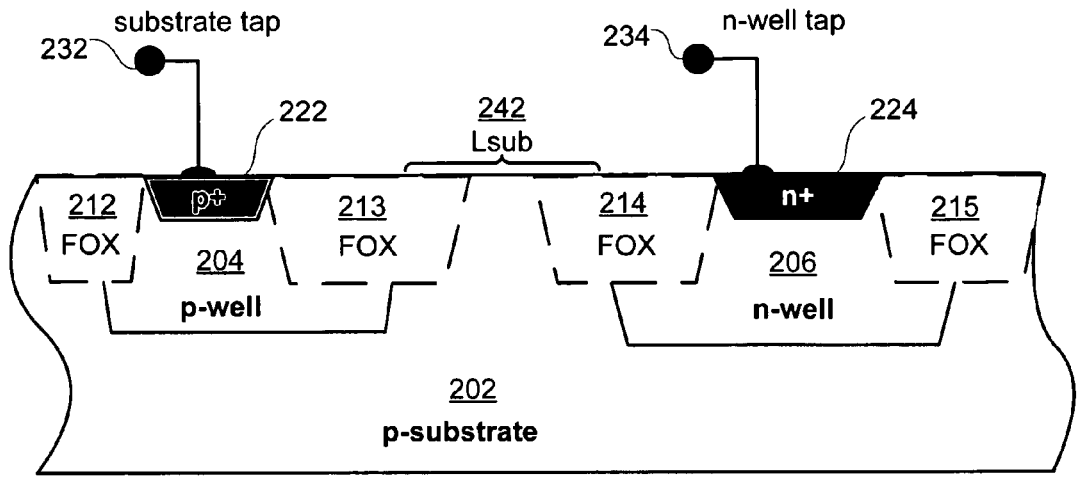
FIG. 2A is a cross-sectional view of a graded junction high voltage p-n junction device according to one embodiment.

FIG. 2A is a cross-sectional view of a graded junction high voltage p-n junction device according to one embodiment. P-n junction device 200A may be formed on p-substrate 202 that includes impurities of p-type. P-substrate 202 includes n-well 206 that is doped with impurities of n-type and p-well 204 that is doped with impurities of p-type. P-substrate 202 itself may also be used instead of p-well 204 in one embodiment.

Optional field oxide regions 212 and 213 may be formed along opposite borders of p-well 204. Similarly, optional field oxide regions 214 and 215 may be formed on opposite sides of n-well 206. P+ doped surface region 222 within p-well 204 may be used for providing a substrate tap contact 232. Similarly, n+ doped surface region 224 within n-well 206 may be used for providing an n-well tap contact 234. These contacts may be used in a circuit to provide the terminals of a p-n junction device such as a diode.

Differently from a standard p-n junction device, device 200A has graded junction space 242 (its length denoted as Lsub) between p-well 204 and n-well 206. The graded-junction region 242 may be substrate (doped about 2 orders of magnitude less than the n-well 206 and p-well 204) or it may be a deposited, implanted or grown region doped at least an order of magnitude less than p-well 204 and n-well 206.

In a manufacturing process, by blocking the higher-doped p-well implants (with photo resist or another material) in the dimension labeled Lsub, graded junction region 242 results. The breakdown voltage of the p-n junction is determined by the doping concentration of the two regions: n-well/p-well or in this case n-well/p-substrate. The breakdown voltage of n-well (typically ~$10^{17}$/cm$^3$)/p-substrate (typically ~$10^{15}$/cm$^3$) junction is much higher than that of the n-well (~$10^{17}$/cm$^3$)/p-well (typically ~$10^{17}$/cm$^3$) junction. In some process technologies a p-well blocking layer is available and can be used as an alternative to substrate in the graded-junction region. The length of the Lsub region may be adjusted to control the breakdown voltage of the device.

A width of the individual FOX regions may be varied depending on design parameters. The FOX regions typically penetrate the p-well (or n-well) regions and graded junction region 242. The length of the graded junction region 242 (Lsub) is, however, determined as the distance between the p-well and n-well regions.

Figure 2B:
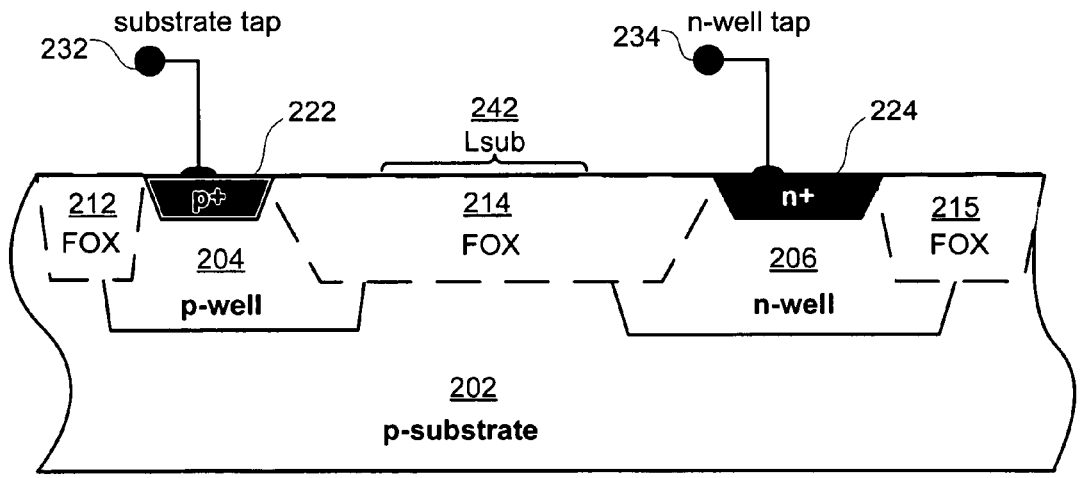
FIG. 2B is a cross-sectional view of a graded junction high voltage p-n junction device according to another embodiment.

FIG. 2B is a cross-sectional view of graded junction high voltage p-n junction device 200B according to another embodiment.

P-n junction device 200B includes similar regions as p-n junction device 200A described above. Differently from FIG. 2A, FOX region 214 is completely disposed in graded junction region 242 in p-n junction device 200B. P-well 204 and n-well 206 are still separated by graded junction region 242 with a length of Lsub providing the same breakdown voltage enhancement as explained above.

Figure 3A:
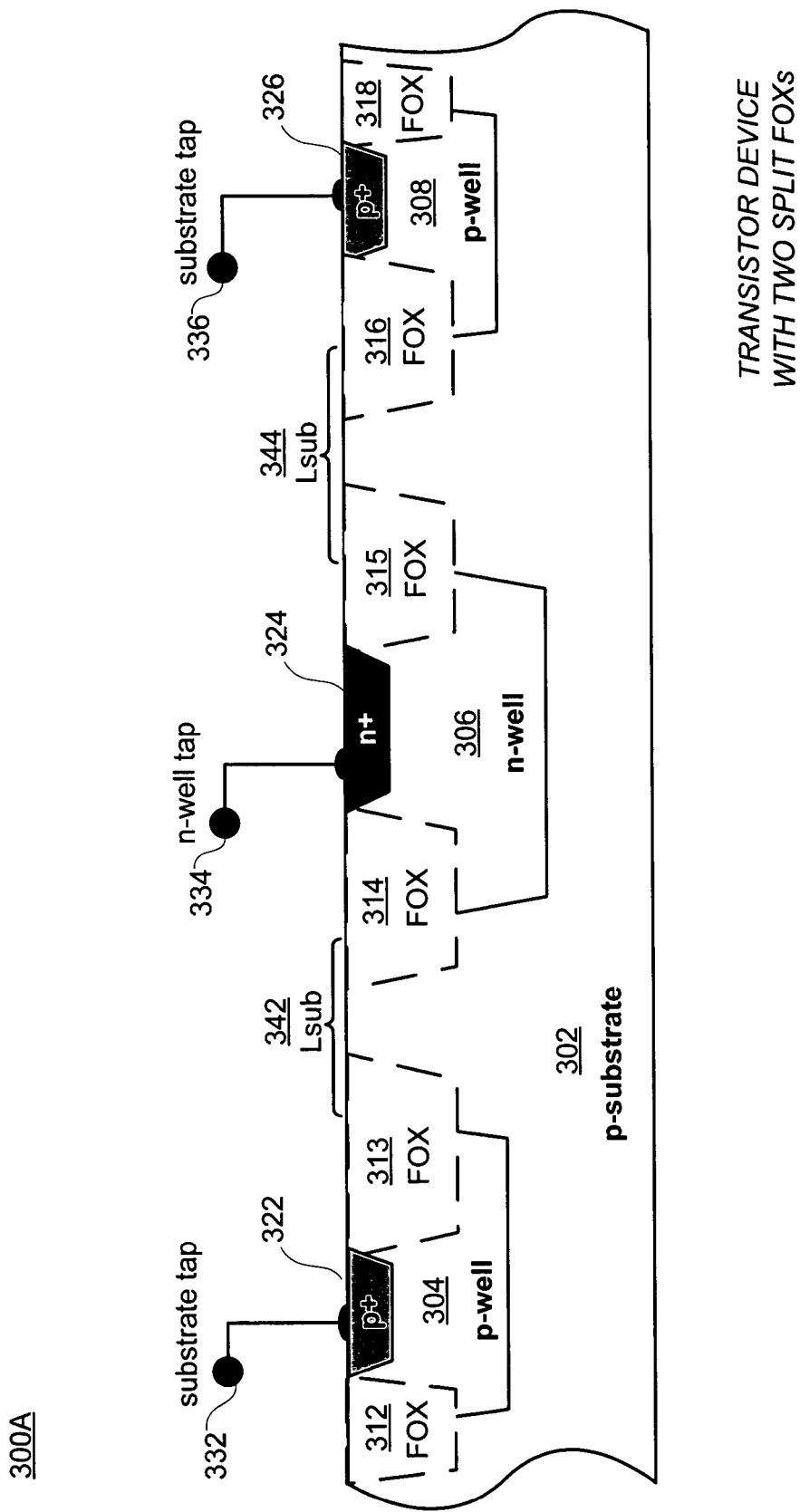
FIG. 3A is a cross-sectional view of a graded junction high voltage transistor device according to one embodiment.

FIG. 3A is a cross-sectional view of graded junction high voltage transistor device 300A according to one embodiment.

Graded junction transistor device 300A may be formed on p-substrate 302 that includes impurities of p-type. P-substrate 302 includes n-well 306 that is doped with impurities of n-type and p-wells 304 and 308 that are doped with impurities of p-type. P-substrate 302 itself may also be used instead of p-wells 304 and 308.

Optional field oxide regions 312, 313 and 316, 318 may be formed along opposite borders of p-wells 304 and 308, respectively. Similarly, optional field oxide regions 314 and 315 may be formed on opposite sides of n-well 306. P+ doped surface regions 322 and 326 within p-wells 304 and 308, respectively, may be used for providing substrate tap contacts 332 and 336. These contacts may be used in a circuit to provide source and/or body terminals for the transistor device 300A.

N+ doped surface region 324 within n-well 306 may be used for providing an n-well tap contact 334, which may be used to provide a drain terminal of the transistor device 300A. In addition to the optional FOX regions, a nominal semiconductor device may be constructed in different orders or sizes of the individual regions.

As illustrated in the figure, p-wells 304 and 308 are separated from n-well 306 by graded junction regions 342 and 344, respectively (each with a length Lsub). As in p-n junction device 200A of FIG. 2, the graded-junction regions may be formed as substrate or they may be a deposited, implanted or grown regions doped at least an order of magnitude less than p-wells 304, 308 and n-well 306.

By providing the lower concentration of implants around the n-wells for the junction, a breakdown voltage of transistor device 300A is enhanced, especially when smaller MFS advanced technology manufacturing processes are implemented. The length of the graded junction regions (Lsub) region may be adjusted to control the breakdown voltage of the device.

A width of the individual FOX regions may also be varied depending on design parameters. The FOX regions typically penetrate the p-well and/or n-well regions and graded junction regions 342, 344. As described above, the length of the graded junction regions 342, 344 (Lsub) is determined as the distance between the p-well and n-well regions.

Transistor device 300A may be used in high-voltage switches and components in devices fabricated in various MOS process (fabrication) technologies including logic CMOS and the like but having relatively high-voltage requirements (e.g., 12 volts in a 3.3 volt process). Such high-voltages are used in charge pumps, programming nonvolatile memory circuits, on-chip LCD (liquid crystal display) display drivers, on-chip field-emission display drivers, and the like.

Transistor device 300A may be Silicon-On-Insulator (SOI) type and the substrate may include a relatively thin layer of Si deposited over a thin film of oxide embedded onto a relatively thick layer of Si. Transistor device 300A may also be Silicon-On-Sapphire (SOS) type and the substrate may include a relatively thin layer of Si over sapphire ($Al_2O_3$). In a further embodiment, transistor device 300A may be GaAs type and the substrate may include a thin layer of Ga deposited over a layer of As.

Figure 3B:
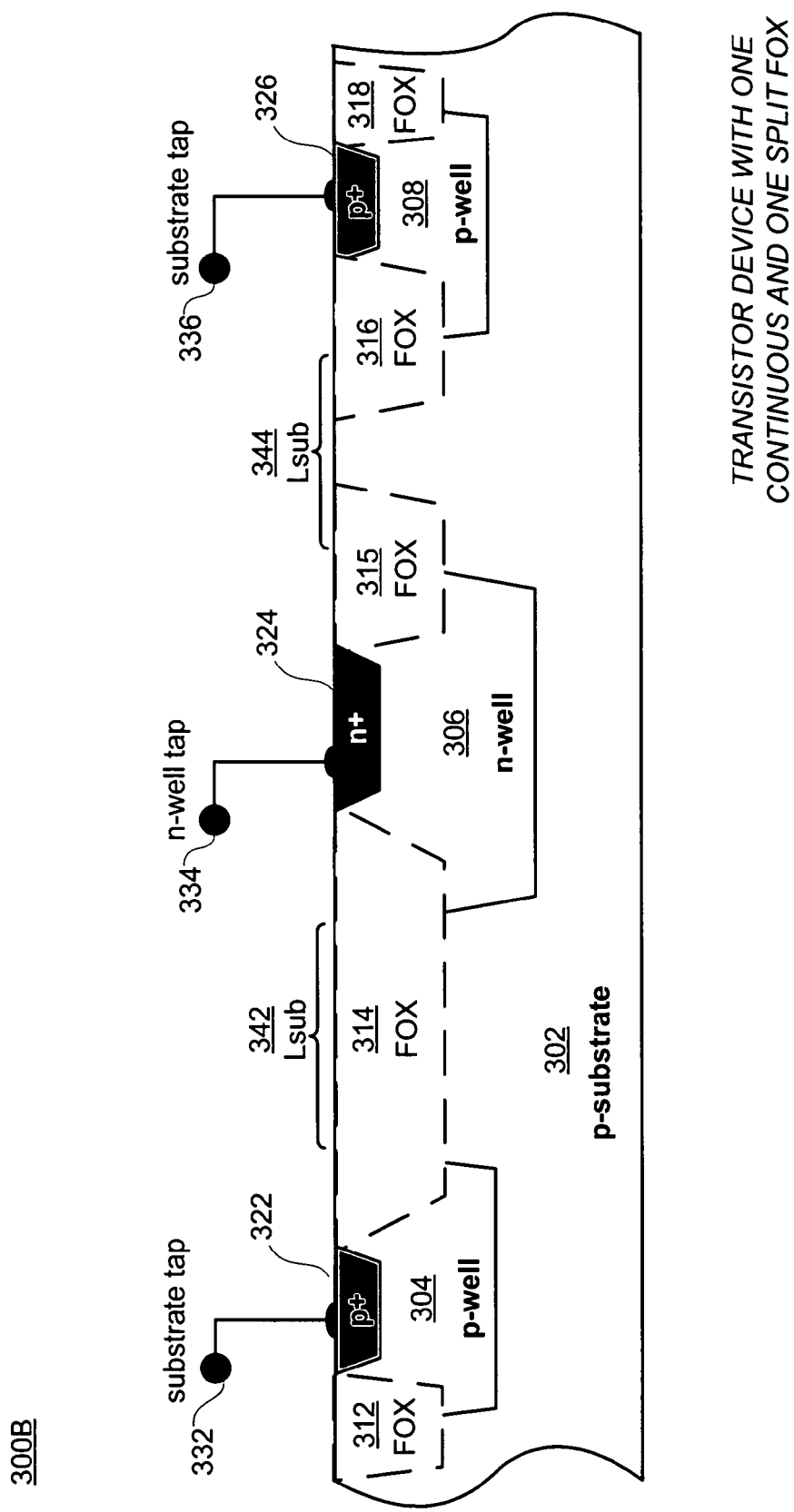
FIG. 3B is a cross-sectional view of a graded junction high voltage transistor device according to another embodiment.

FIG. 3B is a cross-sectional view of graded junction high voltage transistor device 300B according to another embodiment.

Transistor device 300B includes similar regions as transistor device 300A described above. Differently from FIG. 3A, FOX region 314 is completely disposed in graded junction region 342 in transistor device 300B, while graded junction region 344 is still surrounded by two split FOX regions (315 and 316). P-well 304 and n-well 306 are still separated by graded junction region 342 with a length of Lsub providing the same breakdown voltage enhancement as explained above.

Figure 3C:
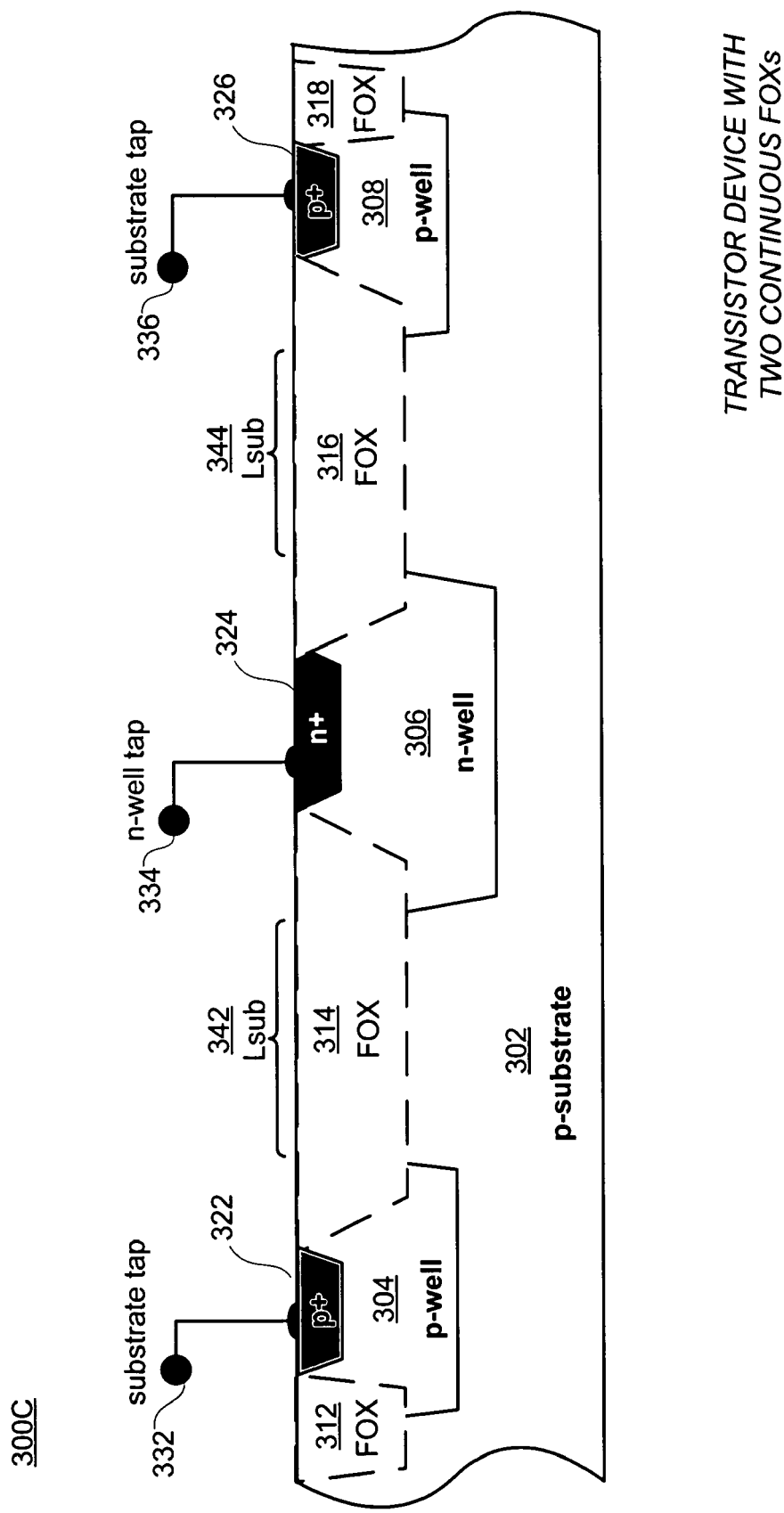
FIG. 3C is a cross-sectional view of a graded junction high voltage transistor device according to a further embodiment.

FIG. 3C is a cross-sectional view of graded junction high voltage transistor device 300C according to a further embodiment.

Transistor device 300C, a different configuration of transistor devices 300A and 300B, includes similar regions as transistor devices 300A and 300B described above. Differently from FIG. 3A, FOX regions 314 and 316 are completely disposed in graded junction regions 342 and 344, respectively, in transistor device 300B. P-wells 304 and 308 are still separated from n-well 306 by graded junction regions 342 and 344 with a length of Lsub providing the same breakdown voltage enhancement as explained above.

Figure 3D:
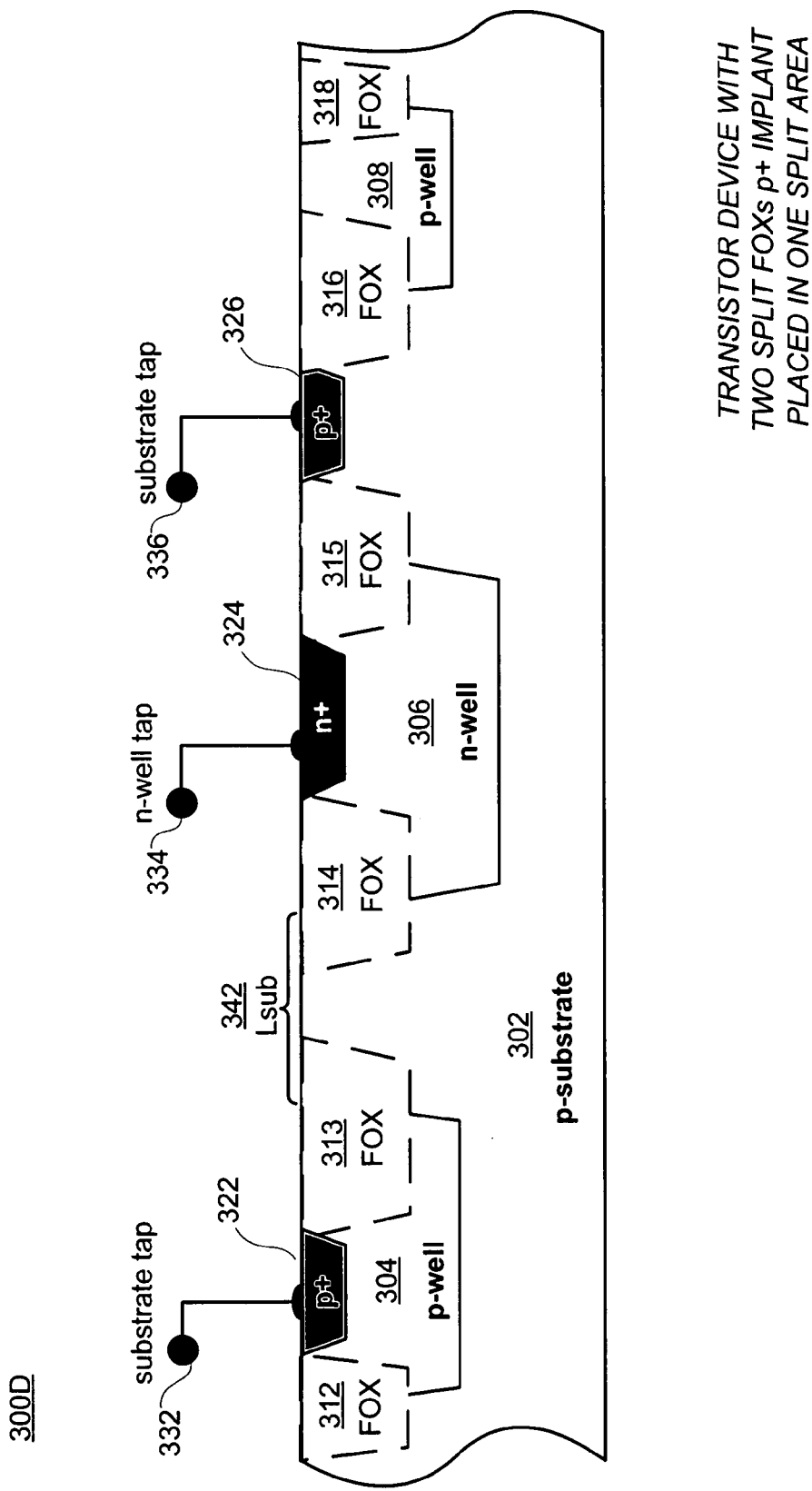
FIG. 3D is a cross-sectional view of a graded junction high voltage transistor device according to yet another embodiment.

FIG. 3D is a cross-sectional view of graded junction high voltage transistor device 300D according to yet another embodiment.

Transistor device 300D includes similar regions as transistor devices 300A, 300B, and 300C described above. Differently from FIG. 3A, p+ doped surface region 326 is disposed in graded junction region 344 between FOX regions 315 and 316 in transistor device 300D. This configuration illustrates that substrate contact(s) may be placed in the graded junction regions in place of the p-well regions. P-wells 304 and 308 are still separated from n-well 306 by graded junction regions 342 and 344 providing a similar breakdown voltage enhancement as explained above.

Figure 3E:
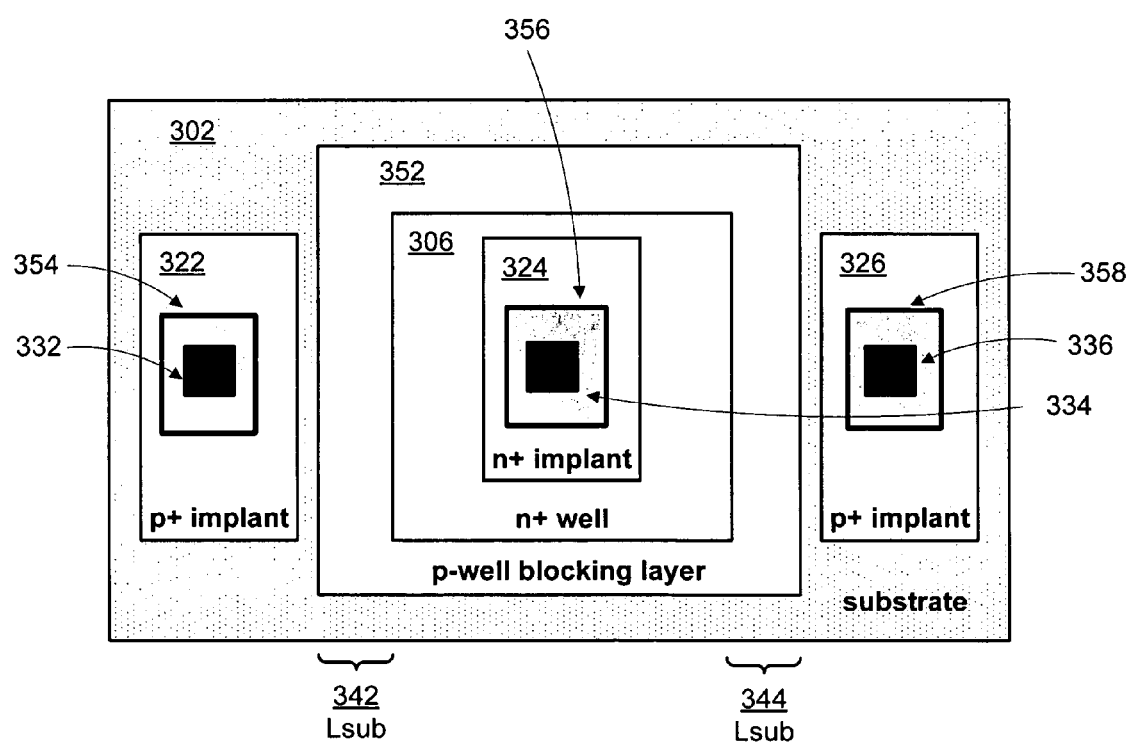
FIG. 3E is a top view of a layout diagram of the graded junction high voltage transistor device of FIG. 3A.

FIG. 3E is a top view of layout diagram 300E of the graded junction high voltage transistor device of FIG. 3A.

Layout diagram 300E includes substrate 302 at bottom layer. Other layers over (or disposed in) substrate 302 include p+ doped surface regions 322 and 326 with respective active regions 354, 358 and contacts 332, 336. P-well blocking layer 352 enables separation of n-well 306 from substrate 302 and p-wells. A distance between each edge of p-well blocking layer 352 and respective sides of n-well 306 provides the Lsub dimension of graded junction regions 342 and 344.

Within n-well 306 is n+ doped surface region 324 disposed with its contact 334. In one embodiment, one or two field oxide layers (not shown) may be provided within n-well 306 on opposite sides of n+ implant region 324. In another embodiment, a gate structure may be disposed over n-well 352 and even a portion of the p+ implant regions 322 and 326.

Figure 4A:
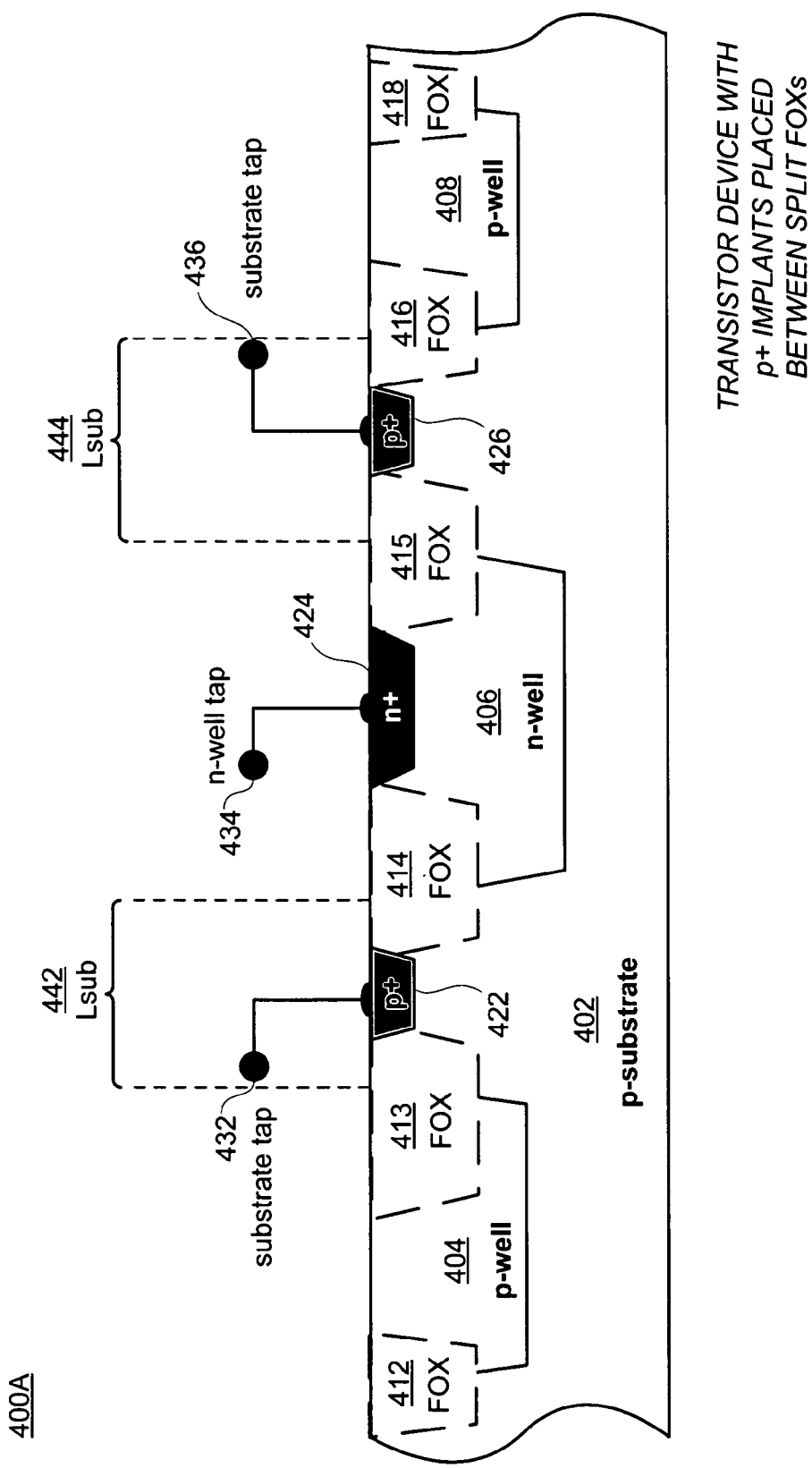
FIG. 4A is a cross-sectional view of a graded junction high voltage transistor device according to a yet further embodiment.

FIG. 4A is a cross-sectional view of a graded junction high voltage transistor device according to a yet further embodiment;

Transistor device 400A includes similar regions as transistor device 300D described previously. Parts of transistor device 400A that are numbered similar to transistor device 300D of FIG. 3D are arranged to function in a likewise manner. Differently from FIG. 3D, both p+ doped surface regions 422 and 426 are disposed in graded junction regions 442 and 444 between FOX regions 413, 414 and 415, 416, respectively. This configuration further illustrates that substrate contact(s) may be placed in both or either of the graded junction regions in place of the p-well regions while providing a similar breakdown voltage enhancement as explained above.

Figure 4B:
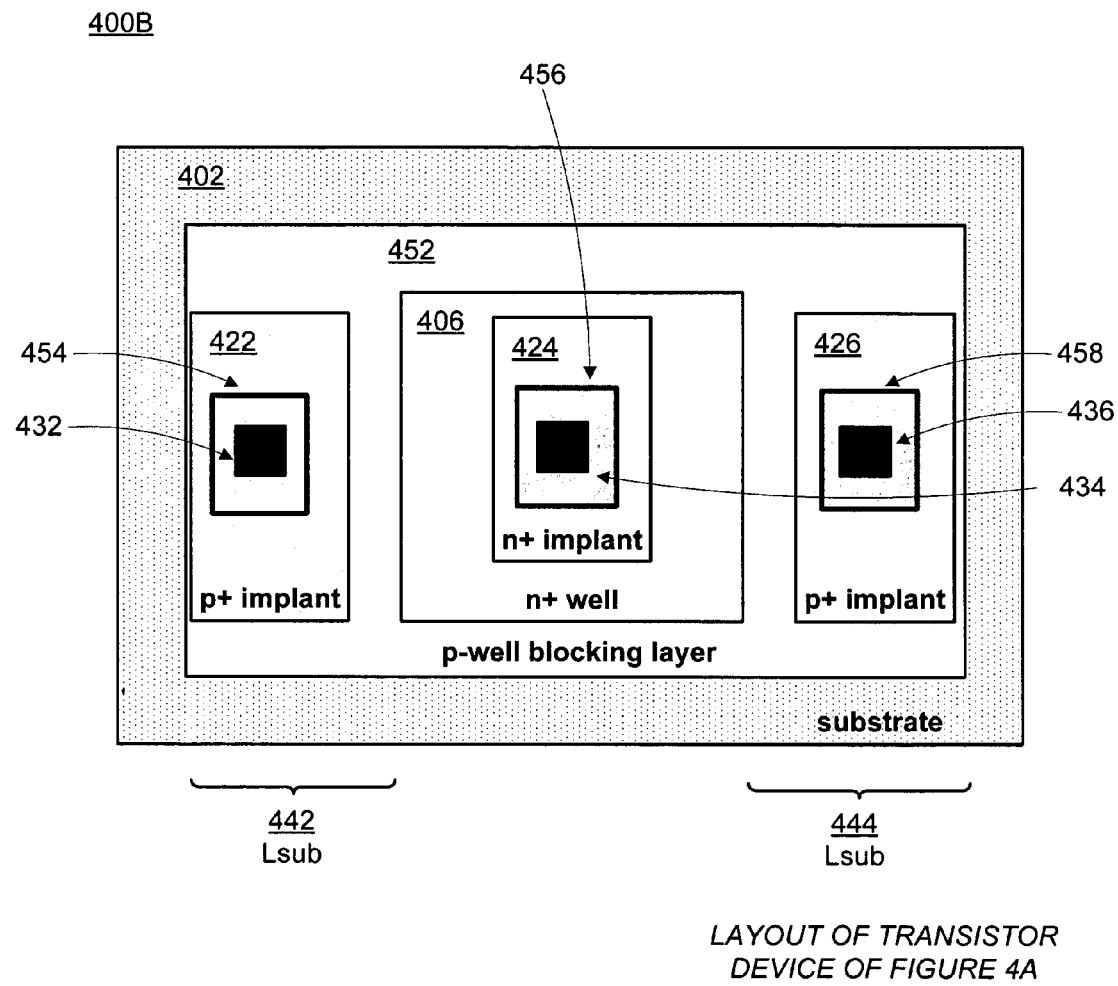
FIG. 4B is a top view of a layout diagram of the graded junction high voltage transistor device of FIG. 4A.

FIG. 4B is a top view of layout diagram 400B of the graded junction high voltage transistor device of FIG. 4A.

Layout diagram 400B includes substrate 402 at bottom layer. Other layers over (or disposed in) substrate 402 include p+ doped surface regions 422 and 426 with respective active regions 454, 458 and contacts 432, 436. Differently from layout diagram 300E of FIG. 3E, p-well blocking layer 452 in layout diagram 400B extends to cover p+ doped surface regions 422 and 426. A distance between each edge of p-well blocking layer 452 and corresponding sides of n-well 406 provides the Lsub dimension of graded junction regions 442 and 444.

Within n-well 306 is n+ doped surface region 324 disposed with its contact 334. In one embodiment, one or two field oxide layers (not shown) may be provided within n-well 306 on opposite sides of n+ implant region 324. In another embodiment, a gate structure may be disposed over n-well 352 and even a portion of the p+ implant regions 322 and 326.

Figure 5A:
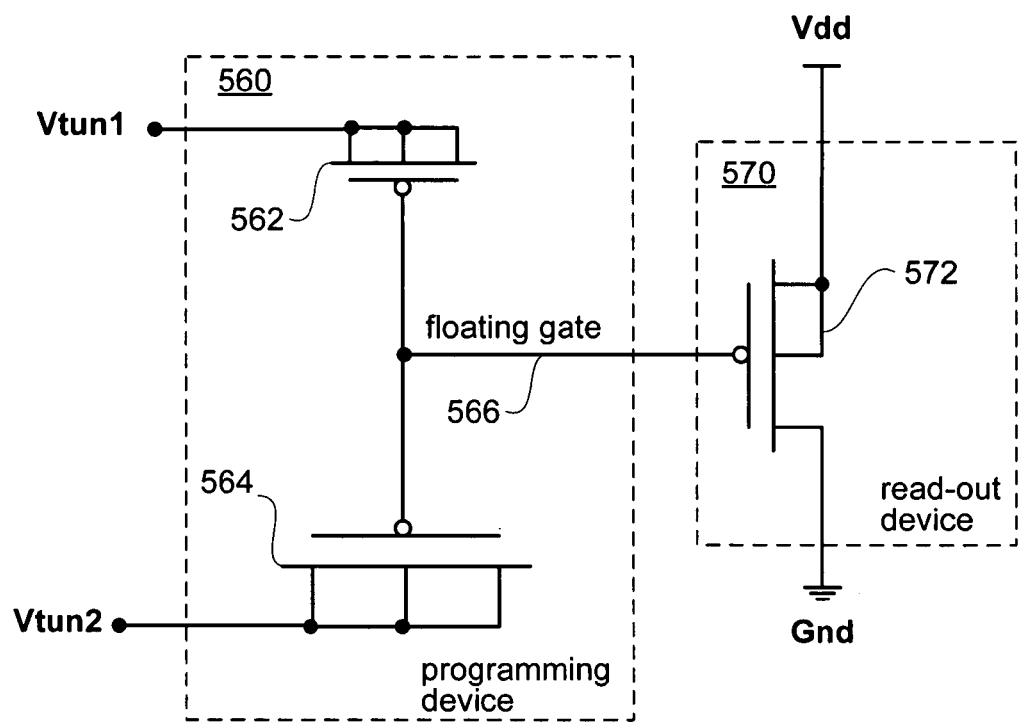
FIG. 5A is a schematic representation of a memory cell with a read-out device and a programming device where one embodiment of the graded junction high voltage transistor device of FIG. 3C may be implemented.

FIG. 5A is a schematic representation of a memory cell with a read-out device and a programming device where one embodiment of the graded junction high voltage transistor device of FIG. 3C may be implemented;

In a memory application, the shared gate structures of transistors 562 and 564, which form together programming device 560, may be implemented as a floating gate 566. By applying programming voltages Vtun1 and Vtun2, floating gate 566 may be charged or discharged corresponding to memory cell states (e.g. bit values "0" or "1"). Read-out device 570 comprising read-out transistor 572 is used to provide the stored memory value to other circuits. Read-out transistor 572 also shares the same floating gate 566.

In an NVM (Non-Volatile Memory) application, circuit 500A acting as an NVM cell operates as follows. During an erase operation, electrons are removed from a floating gate of the NVM cell, thereby adjusting and lowering the switch point voltage of the NVM cell. During a program operation, electrons are inserted onto the floating gate of the NVM cell, thereby adjusting and raising the switch point voltage of the NVM cell. Thus, during program and erase operations, the switch point voltages of selected NVM cells in an NVM array are changed. During a read operation, read voltages are applied to selected NVM cells. In response, output voltage of these selected NVM cells reflect a bit value based on the stored charges in their floating gate.

Floating gate type NVM cells may include charge adjustment circuits that are arranged to inject electrons to the floating gate of the storage element (inverter circuit) employing mechanisms such as impact-ionized hot-electron injection, impact-ionized hot-electron injection, Fowler-Nordheim (FN) tunneling, channel hot-electron tunneling, and band-to-band tunneling induced electron injection. The shared gate terminal may be discharged by FN tunneling.

Figure 5B:
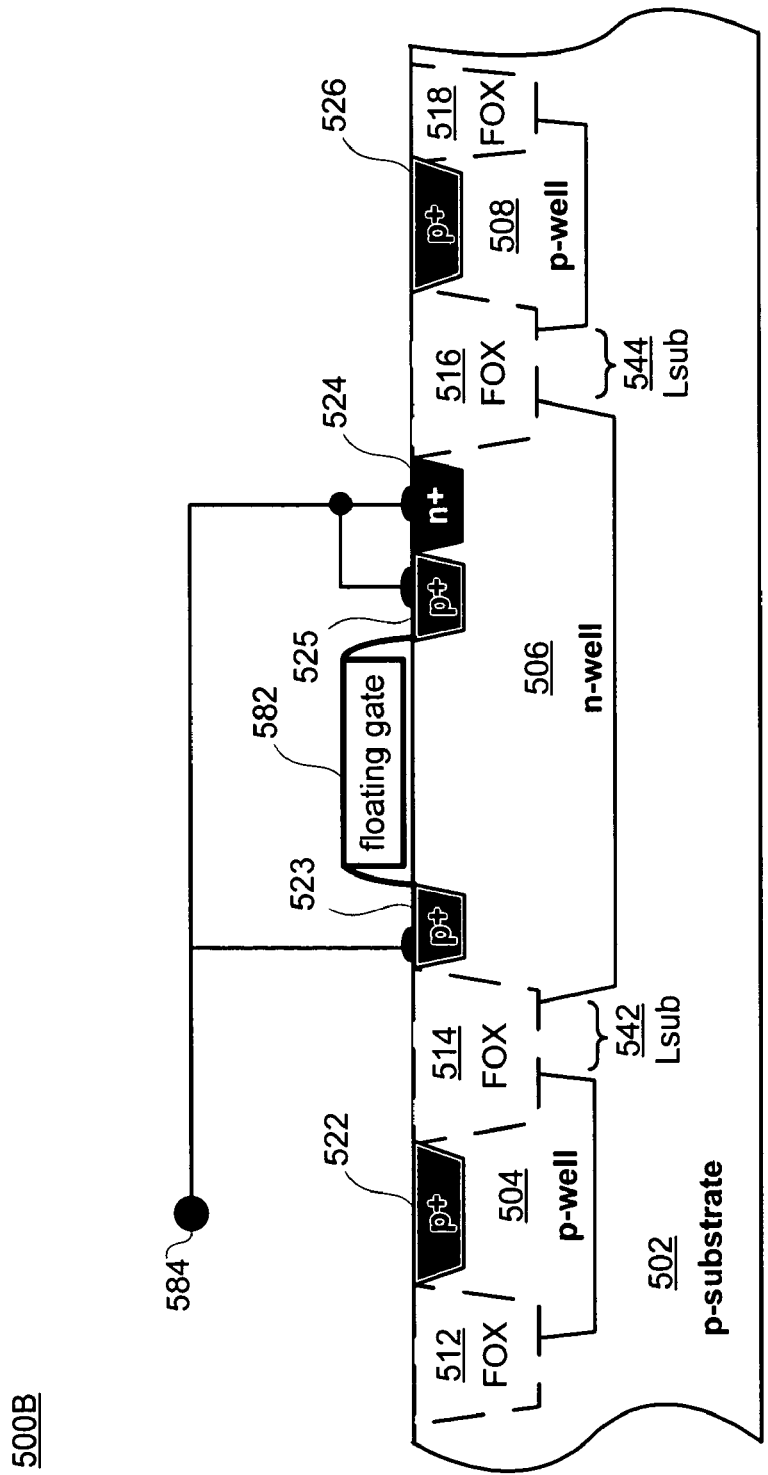
FIG. 5B is a cross-sectional view of the graded junction high voltage transistor device implementation of FIG. 5A.

FIG. 5B is a cross-sectional view of the graded junction high voltage transistor device implementation of FIG. 5A.

Transistor device 500B includes similar regions to transistor device 300A like p-wells 504, 508 and n-well 506 in p-substrate 502; FOX regions 512, 514, 516, and 518; p+ doped surface regions 522 and 526 within respective p-wells; and graded junction regions 542 and 544 between the p-wells and the n-well.

In transistor device 500B, n+ doped surface region 524 is disposed in n-well 506 adjacent to FOX region 516. In addition, either one or both of the p+ doped surface regions 523 and 525 are disposed within the n-well. P+ doped surface region 523 is adjacent to FOX region 514, and p+ doped surface region 525 is disposed adjacent to n+ doped surface region 524. Floating gate structure 582 of transistor device 500B may be disposed over a channel defined by p+ doped surface regions 523 and 525 within n-well 506. P+ doped surface regions 523 and 525 may be overlapping, abutting, approximately adjacent to the floating gate structure 582.

Floating gate structure 582 disposed over a dielectric layer over the channel region may comprise n+ doped polysilicon material, p+ doped polysilicon material, metal, or any other suitable material used for forming a conductive gate.

In the programming device configuration of FIG. 5A, p+ doped surface regions 523 and 525 may be connected to n+ doped surface region 524 for programming voltage (e.g. Vtun1 or Vtun2) at node 584 with substrate tap on any one of the p+ doped surface regions.

Figure 6:
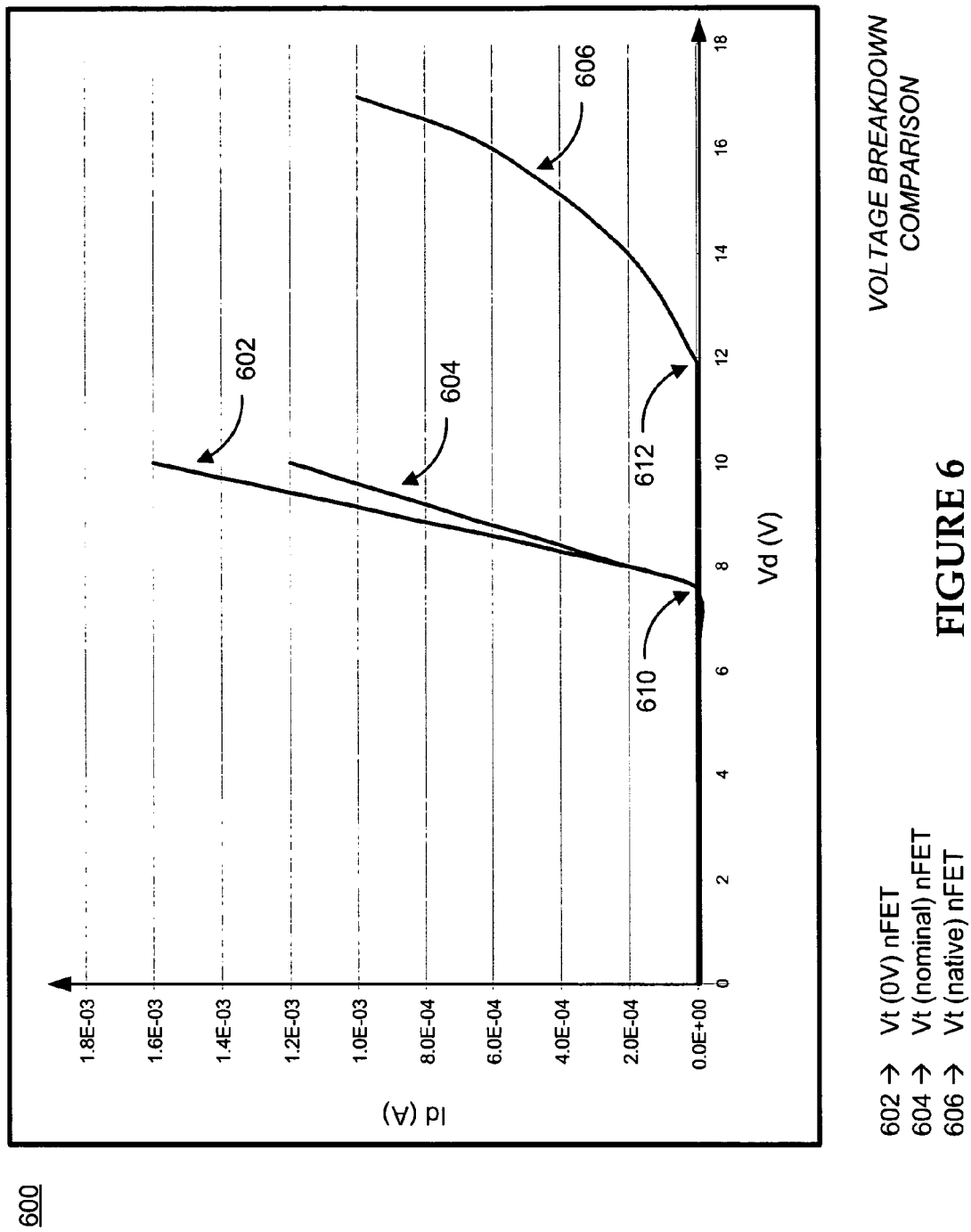
FIG. 6 is a diagram comparing breakdown voltage characteristics of a nominal Vt nFET device, a zero Vt nFET device, and an nFET device according to embodiments.

FIG. 6 is a diagram comparing breakdown voltage characteristics of a nominal Vt nFET device, a zero Vt nFET device, and a native nFET device according to embodiments.

Diagram 600 includes three curves. Curve 602 represents the drain current Id of a zero threshold voltage (Vt) nFET device with increasing drain voltage Vd. Curve 604 represents the drain current Id of a standard nFET device with increasing drain voltage Vd. Finally, curve 606 represents a change of the drain current Id of a native nFET (nFET in p-substrate instead of p-well for nominal nFET) device according to embodiments with increased breakdown voltage.

As diagram 600 shows, the drain current of each device remains substantially constant around 0 A until the breakdown voltage value is reached. For the standard FET devices at both zero and nominal Vt (curves 602 and 604), the breakdown voltage is at about 7.6V (610). The drain current increases approximately linearly after that point.

For the FET fabricated as native, however, the breakdown voltage is at about 11.8V (612). This represents an improvement of about 4.2V in the FET device's capability of handling higher voltages for n+ diode to p breakdown without an additional mask cost.

This detailed description is presented largely in terms of cross-sectional diagrams, schematics, and layout diagrams. Indeed, such descriptions and representations are the type of convenient labels used by those skilled in integrated circuit design arts to effectively convey the substance of their work to others skilled in the art. A person skilled in the art of integrated circuit design may use these descriptions to readily generate specific instructions for implementing devices according to the embodiments.

The FET devices of described herein may include a FinFET, a GaAsFET, and a Metal-Semiconductor Field Effect Transistor (MESFET), in addition to MOSFET. Furthermore, embodiments may also be easily implemented in many standard MOS processes, such as, for example, p-well, n-well, twin-tub (n- and p-wells), and the like.

In the above, the order of implanted regions is not constrained to what is shown, and different orders may be possible. In addition, some implanted regions within each device can be modified, deleted, or new ones added without departing from the scope and spirit of the claimed subject matter. Plus other, optional implanted regions and FOX layers can be implemented with these methods, as will be inferred from the earlier description.

The electrical circuit(s) described in this document can be manufactured in any number of ways, as will be appreciated by the persons skilled in the art. One such way is as integrated circuit(s), as described below.

Schematic-type inputs can be provided for the purpose of preparing one or more layouts. These inputs can include as little as a schematic of a circuit, to more including relative sizes of circuit components and the like, as will be appreciated by a person skilled in the art for such inputs. These inputs can be provided in any suitable way, such as merely in writing, or electronically, as computer files and the like. Some of these computer files can be prepared with the assistance of suitable design tools. Such tools often include instrumentalities for simulating circuit behaviors and the like.

These inputs can be provided to a person skilled in the art of preparing layouts. This, whether the person is within the same company, or another company, such as under a contract.

A layout can be prepared that embodies the schematic-type inputs by the person skilled in the art. The layout is itself preferably prepared as a computer file. It may be additionally checked for errors, modified as needed, and so on.

In the above, computer files can be made from portions of computer files. For example, suitable individual designs can be assembled for the electrical components and circuits indicated in the schematic-type inputs. The individual designs can be generated anew, or selected from existing libraries. In the layout phase, the assembled designs can be arranged to interoperate, so as to implement as integrated circuit(s) the electrical circuit(s) of the provided schematic-type inputs. These computer files can be stored in storage media, such as memories, whether portable or not, and the like.

Then a special type of computer file can be synthesized from the prepared layout, in a manner that incorporates the prepared layout, which has the embodied schematic-type inputs. Such files are known in the industry as IC chip design files or tapeout files, and express instructions for machinery as to how to process a semiconductor wafer, so as to generate an integrated circuit that is arranged as in the incorporated layout.

The synthesized tapeout file is then transferred to a semiconductor manufacturing plant, which is also known as a foundry, and so on. Transferring can be by any suitable means, such as over an electronic network. Or a tapeout file can be recorded in a storage medium, which in turn is physically shipped to the mask manufacturer.

The received tapeout file is then used by mask making machinery as instructions for processing a semiconductor wafer. The wafer, as thus processed, now has one or more integrated circuits, each made according to the layout incorporated in the tapeout file. If more than one, then the wafer can be diced to separate them, and so on.

In this description, numerous details have been set forth in order to provide a thorough understanding. In other instances, well-known features have not been described in detail in order to not obscure unnecessarily the description.

A person skilled in the art will be able to practice the embodiments in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A semiconductor device comprising:
a substrate that includes impurities of p-type, the substrate comprising:
an n-well within the substrate that includes impurities of n-type;
a p-well within the substrate that includes impurities of p-type, wherein the p-well is horizontally spaced apart from the n-well by a graded junction space within the substrate, the graded junction space between the p-well and the n-well of a width between 0.6 micrometers and 20 micrometers and doped with a concentration of p-type impurities at least two orders of magnitude less than a concentration of impurities of p-type in the p-well and a concentration of impurities of n-type in the n-well;
a first field oxide (FOX) layer in the substrate between the n-well and the p-well;
a first tap to the n-well that is surrounded by a first region implanted with impurities of n-type; and
a second tap to the p-well that is surrounded by a second region implanted with impurities of p-type.

2. The device of claim 1, wherein the first FOX layer is spaced apart from the n-well.

3. The device of claim 1, wherein the first FOX layer is spaced apart from the p-well.

4. The device of claim 1, further comprising:
a second FOX layer in the substrate, between the n-well and the first FOX layer, and separated from the first FOX layer such that the first and the second FOX layers are partially within the graded junction space.

5. The device of claim 4, wherein the first FOX layer is spaced apart from the p-well.

6. The device of claim 4, wherein the second FOX layer is spaced apart from the n-well.

7. The device of claim 4, further comprising:
a third tap to the graded junction space that is surrounded by a third region implanted with impurities of p-type.

8. A semiconductor device comprising:
a substrate that includes impurities of p-type, the substrate comprising:
an n-well within the substrate that includes impurities of n-type;
a first p-well within the substrate that includes impurities of p-type, wherein the first p-well is horizontally spaced apart from the n-well by a first graded junction space within the substrate, the first graded junction space between the first p-well and the n-well of a first width between 0.6 micrometers and 20 micrometers and doped with a concentration of p-type impurities at least two orders of magnitude less than a concentration of impurities of p-type in the first p-well and a concentration of impurities of n-type in the n-well;
a first field oxide (FOX) layer in the substrate between the n-well and the first p-well;
a second p-well within the substrate that includes impurities of p-type, wherein the second p-well is horizontally spaced apart from the n-well in an opposite direction of the first p-well by a second graded junction space within the substrate, the second graded junction space between the second p-well and the n-well of a second width between 0.6 micrometers and 20 micrometers and doped with a concentration of p-type impurities at least two orders of magnitude less than a concentration of impurities of p-type in the second p-well and a concentration of impurities of n-type in the n-well;
a second FOX layer in the substrate between the n-well and the second p-well;
a first tap to the n-well that is surrounded by a first region implanted with impurities of n-type;
a second tap to the first p-well that is surrounded by a second region implanted with impurities of p-type; and
a third tap to the second p-well that is surrounded by a third region implanted with impurities of p-type.

9. The device of claim 8, wherein at least one of the first FOX layer and the second FOX layer is spaced apart from the n-well.

10. The device of claim 8, wherein the first FOX layer is spaced apart from the first p-well.

11. The device of claim 8, wherein the second FOX layer is spaced apart from the second p-well.

12. The device of claim 8, further comprising:
a third FOX layer in the substrate, between the n-well and the first FOX layer, and separated from the first FOX layer such that the first and the third FOX layers are partially within the first graded junction space.

13. The device of claim 12, wherein the first FOX layer is spaced apart from the first p-well.

14. The device of claim 12, wherein the third FOX layer is spaced apart from the n-well.

15. The device of claim 12, further comprising:
a fourth tap to the first graded junction space that is surrounded by a fourth region implanted with impurities of p-type.

16. The device of claim 12, further comprising:
a fourth FOX layer in the substrate, between the n-well and the second FOX layer, and separated from the second FOX layer such that the second and the fourth FOX layers are partially within the second graded junction space.

17. The device of claim 16, wherein the fourth FOX layer is spaced apart from the second p-well.

18. The device of claim 16, wherein the fourth FOX layer is spaced apart from the n-well.

19. The device of claim 16, further comprising:
a fifth tap to the second graded junction space that is surrounded by a fifth region implanted with impurities of p-type.

20. The device of claim 16, wherein the first graded junction space and the second graded junction space are approximately identical.

21. The device of claim 16, wherein the semiconductor device is used in at least one of a charge pump circuit, a high voltage switch circuit, and a tunneling circuit.

22. The device of claim 16, wherein the semiconductor device is a lateral diffusion (LD) NMOS transistor.

23. The device of claim 8, further comprising:
a floating gate structure located over the n-well that is separated from the n-well by a dielectric on the surface of the substrate;
a fourth tap to the n-well that is surrounded by a fourth region located about the floating gate structure and implanted with impurities of p-type; and
a fifth tap to the n-well that is surrounded by a fifth region located about the floating gate structure and implanted with impurities of p-type.

24. The device of claim 23, wherein the fourth region is adjacent to the first FOX layer, and wherein the fifth region is adjacent to the first region.

25. The device of claim 23, wherein the floating gate structure is arranged such that the fourth region and the fifth region are one of overlapping, non-overlapping, and approximately adjacent to the floating gate.

26. The device of claim 23, wherein the first FOX layer and the second FOX layer are arranged such that the n-well is separated from the first p-well and the second p-well by a distance of between 0.6 micrometers and 20 micrometers.

27. A non-transitory program storage device readable by a machine, tangibly embodying a program of instructions executable by the machine to perform method steps for forming a semiconductor, the method steps comprising:
forming an n-well within a substrate that includes impurities of p-type, the n-well including impurities of n-type;
forming a first tap to the n-well that is surrounded by a first region implanted with impurities of n-type;
forming a p-well within the substrate that includes impurities of p-type, wherein the p-well is horizontally spaced apart from the n-well by a graded junction space within the substrate, the graded junction space between the p-well and the n-well of a width between 0.6 micrometers and 20 micrometers and doped with a concentration of p-type impurities at least two orders of magnitude less than a concentration of impurities of p-type in the p-well and a concentration of impurities of n-type in the n-well;
forming a second tap to the p-well that is surrounded by a second region implanted with impurities of p-type; and
forming a first field oxide (FOX) layer in the substrate between the n-well and the p-well.

28. The program storage device of claim 27, wherein the first FOX layer is spaced apart from the n-well.

29. The program storage device of claim 27, wherein the first FOX layer is spaced apart from the p-well.

30. The program storage device of claim 27, in which the integrated circuit further comprises:
a second FOX layer in the substrate, between the n-well and the first FOX layer, and separated from the first FOX layer such that the first and the second FOX layers are partially within the graded junction space.

31. The program storage device of claim 30, wherein the first FOX layer is spaced apart from the p-well.

32. The program storage device of claim 30, wherein the second FOX layer is spaced apart from the n-well.

33. The program storage device of claim 30, in which the integrated circuit further comprises:
a third tap to the graded junction space that is surrounded by a third region implanted with impurities of p-type.

34. A non-transitory program storage device readable by a machine, tangibly embodying a program of instructions executable by the machine to perform method steps for forming a semiconductor, the method steps comprising:
forming a substrate that includes impurities of p-type;
forming an n-well within a substrate that includes impurities of p-type, the n-well including impurities of n-type;
forming a first tap to the n-well that is surrounded by a first region implanted with impurities of n-type;
forming a first p-well within the substrate that includes impurities of p-type, wherein the first p-well is horizontally spaced apart from the n-well by a first graded junction space within the substrate, the first graded junction space between the first p-well and the n-well of a first width between 0.6 micrometers and 20 micrometers and doped with a concentration of p-type impurities at least two orders of magnitude less than a concentration of impurities of p-type in the first p-well and a concentration of impurities of n-type in the n-well;
forming a second tap to the first p-well that is surrounded by a second region implanted with impurities of p-type;
forming a first field oxide (FOX) layer in the substrate between the n-well and the first p-well;
forming a second p-well within the substrate that includes impurities of p-type, wherein the second p-well is also horizontally spaced apart from the n-well in an opposite direction of the first p-well by a second graded junction space within the substrate, the second graded junction space between the second p-well and the n-well of a second width between 0.6 micrometers and 20 micrometers and doped with a concentration of p-type impurities at least two orders of magnitude less than a concentration of impurities of p-type in the second p-well and a concentration of impurities of n-type in the n-well;
forming a third tap to the second p-well that is surrounded by a third region implanted with impurities of p-type; and
forming a second FOX layer in the substrate between the n-well and the second p-well.

35. The program storage device of claim 34, in which at least one of the first FOX layer and the second FOX layer is spaced apart from the n-well.

36. The program storage device of claim 34, wherein the first FOX layer is spaced apart from the first p-well.

37. The program storage device of claim 34, wherein the second FOX layer is spaced apart from the second p-well.

38. The program storage device of claim 34, in which the integrated circuit further comprises:
a third FOX layer in the substrate, between the n-well and the first FOX layer, and separated from the first FOX layer such that the first and the third FOX layers are partially within the first graded junction space.

39. The program storage device of claim 38, wherein the first FOX layer is spaced apart from the first p-well.

40. The program storage device of claim 38, wherein the third FOX layer is spaced apart from the n-well.

41. The program storage device of claim 38, wherein a fourth tap to the first graded junction space that is surrounded by a fourth region implanted with impurities of p-type.

42. The program storage device of claim 34, wherein the method further comprises:

forming a floating gate structure located over the n-well that is separated from the n-well by a dielectric on the surface of the substrate;

forming a fourth tap to the n-well that is surrounded by a fourth region located about the floating gate structure and implanted with impurities of p-type; and forming a fifth tap to the n-well that is surrounded by a fifth region located about the floating gate structure and implanted with impurities of p-type.

43. The program storage device of claim 42, wherein the fourth region is adjacent to the first FOX layer, and wherein the fifth region is adjacent to the first region.

44. The program storage device of claim 42, wherein the method further comprises:

forming the floating gate structure such that the fourth region and the fifth region are one of overlapping, non-overlapping, and approximately adjacent to the floating gate.

45. The program storage device of claim 42, wherein the method further comprises:

forming the first FOX layer and the second FOX layer such that the n-well is separated from the first p-well and the second p-well by a distance of between 0.6 micrometers and 20 micrometers.

\* \* \* \* \*